US011108396B2

(12) United States Patent
Sanchez

(10) Patent No.: US 11,108,396 B2
(45) Date of Patent: Aug. 31, 2021

(54) MULTIVOLTAGE HIGH VOLTAGE IO IN LOW VOLTAGE TECHNOLOGY

(71) Applicant: NXP USA, Inc., Austin, TX (US)

(72) Inventor: Hector Sanchez, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/779,532

(22) Filed: Jan. 31, 2020

(65) Prior Publication Data
US 2021/0242871 A1 Aug. 5, 2021

(51) Int. Cl.
*H03K 19/0185* (2006.01)
*H03K 3/037* (2006.01)

(52) U.S. Cl.
CPC ..... *H03K 19/018521* (2013.01); *H03K 3/037* (2013.01)

(58) Field of Classification Search
CPC .............. H03K 3/037; H03K 19/0185; H03K 19/018507; H03K 19/018521
USPC ..................................... 326/80, 81; 327/333
See application file for complete search history.

(56) References Cited

U.S. PATENT DOCUMENTS

| | | | | |
|---|---|---|---|---|
| 5,963,057 A * | 10/1999 | Schmitt | ............ | H03K 19/00315 326/103 |
| 6,064,227 A * | 5/2000 | Saito | ................ | H03K 19/00315 326/68 |
| 6,130,557 A * | 10/2000 | Drapkin | ........... | H03K 19/00315 326/68 |
| 6,429,716 B1 * | 8/2002 | Drapkin | ........... | H03K 19/00315 323/313 |
| 6,777,755 B2 | 8/2004 | Humphrey et al. | | |
| 7,428,719 B2 | 9/2008 | Jaska et al. | | |
| 8,098,073 B2 | 7/2012 | Butt et al. | | |
| 8,415,663 B2 | 4/2013 | Ping et al. | | |
| 8,606,193 B2 | 12/2013 | Ko et al. | | |
| 8,904,248 B2 | 12/2014 | Park et al. | | |
| 9,344,088 B1 | 5/2016 | Sanchez | | |
| 9,356,577 B2 | 5/2016 | Sanchez et al. | | |
| 9,503,090 B2 | 11/2016 | Fifield | | |
| 10,114,074 B2 | 10/2018 | Loke et al. | | |
| 2003/0231044 A1 | 12/2003 | Lundberg | | |
| 2004/0238962 A1 | 12/2004 | Jung et al. | | |
| 2006/0091907 A1 * | 5/2006 | Khan | ................... | H03K 17/102 326/81 |
| 2007/0104111 A1 | 5/2007 | Kakizawa | | |
| 2007/0247190 A1 | 10/2007 | Chen | | |
| 2014/0210014 A1 | 7/2014 | Ma et al. | | |
| 2015/0294970 A1 | 10/2015 | Jakushokas et al. | | |
| 2016/0105180 A1 | 4/2016 | Kerr et al. | | |

* cited by examiner

*Primary Examiner* — William Hernandez

(57) ABSTRACT

A multi-voltage, high voltage I/O buffer in low-voltage technology is disclosed. In one embodiment, the I/O buffer includes a logic circuit configured to generate a signal based on a data signal and a first control signal. A level shifter is coupled between a supply voltage terminal and a ground terminal, and the level shifter is generates first and second output signals in first and second voltage domains, respectively, at first and second nodes, respectively, based on the signal from the logic circuit. A control circuit is coupled between the second node and a third node. The control circuit transmits the second output signal to the third node when the first control signal is asserted, and the control circuit couples the third node to the ground terminal when the first control signal is not asserted.

20 Claims, 8 Drawing Sheets

MULTIVOLTAGE HIGH VOLTAGE IO IN LOW VOLTAGE TECHNOLOGY

BACKGROUND

Integrated circuits (ICs) such as System on Chips (SoCs), microcontrollers (MCUs), etc., communicate with external components such as dynamic random access memory (DRAM), dual data rate (DDR) memory, etc., through input output (I/O) buffers. Generally I/O buffers have input interfaces for communicating with core circuits (e.g., a central processing unit), and output interfaces for communicating with the external components via I/O pads. The input and output interfaces typically operate in different voltage domains. Binary signals in different voltage domains have distinct logic levels. I/O buffers employ level shifters for accommodating the difference in voltage domains by translating logic levels (i.e. logic low voltage and logic high voltage) of signals that pass between the different voltage domains.

BRIEF DESCRIPTION OF THE DRAWINGS

The present technology may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
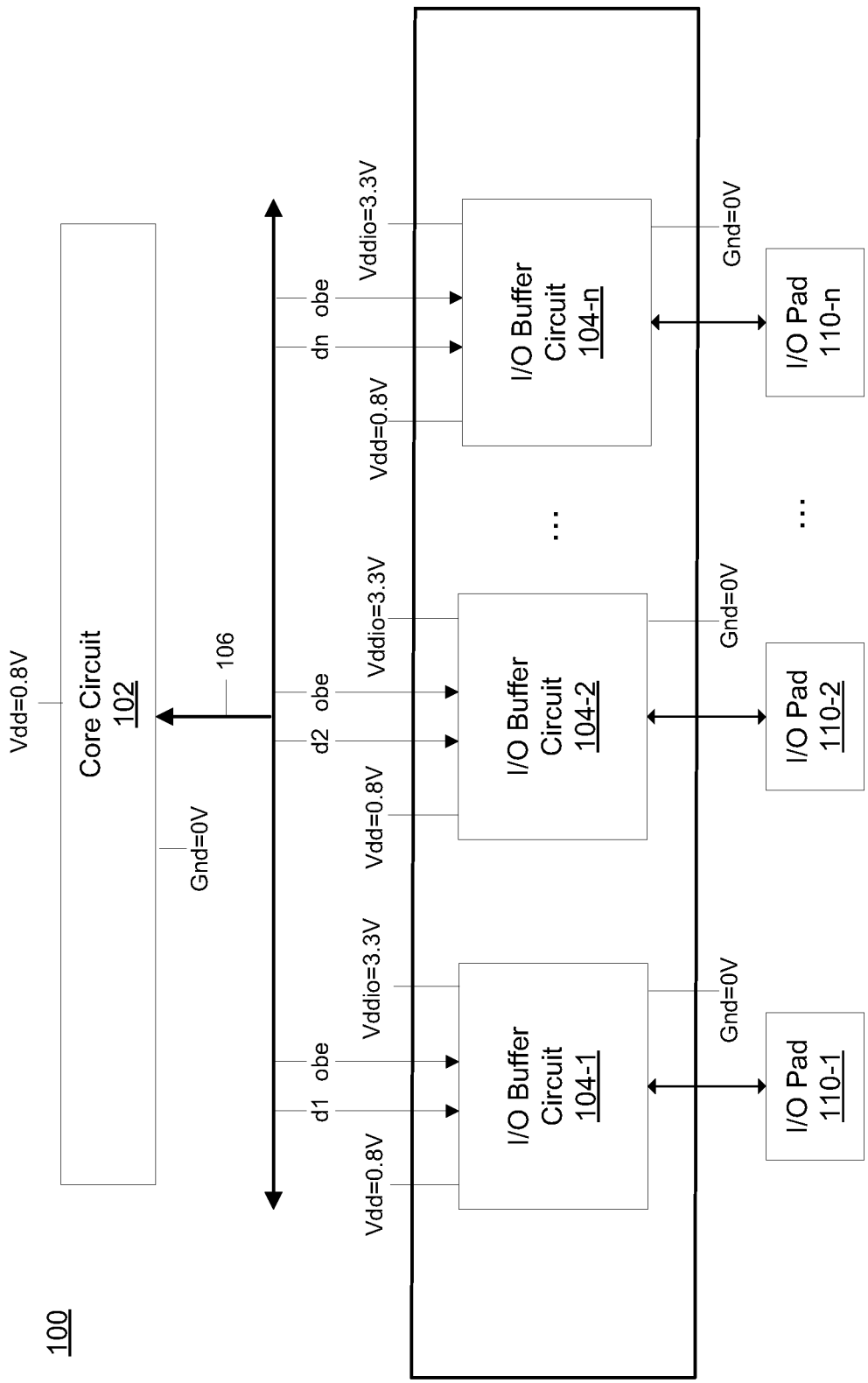
FIG. 1 is a block diagram that illustrates an example IC that includes I/O buffers.

FIG. 1 illustrates relevant components of an example IC 100 in block diagram form. IC 100 contains core circuit 102 in data communication with a bank of I/O buffer circuits 104 via data bus 106. Core circuit 102 is coupled to core supply voltage Vdd=0.8V, while I/O buffers 104 are coupled to Vdd and output supply voltage Vddio=3.3V. For purposes of explanation Vdd=0.8V, it being understood that Vdd should not be limited thereto. Also for purposes of, except where noted below, Vddio=3.3 V it being understood that Vddio should not be limited thereto.

Core circuit 102 may include various devices including a central processing unit (CPU). I/O buffers 104 can receive data signals d from core circuit 102. I/O buffers 104 can also receive signals that control their operation. For example I/O buffers 104 can receive an output buffer enable (obe) control signal from core circuit 102, which disables (tristates) the I/O buffers 104 when obe=0V.

Figure 2:
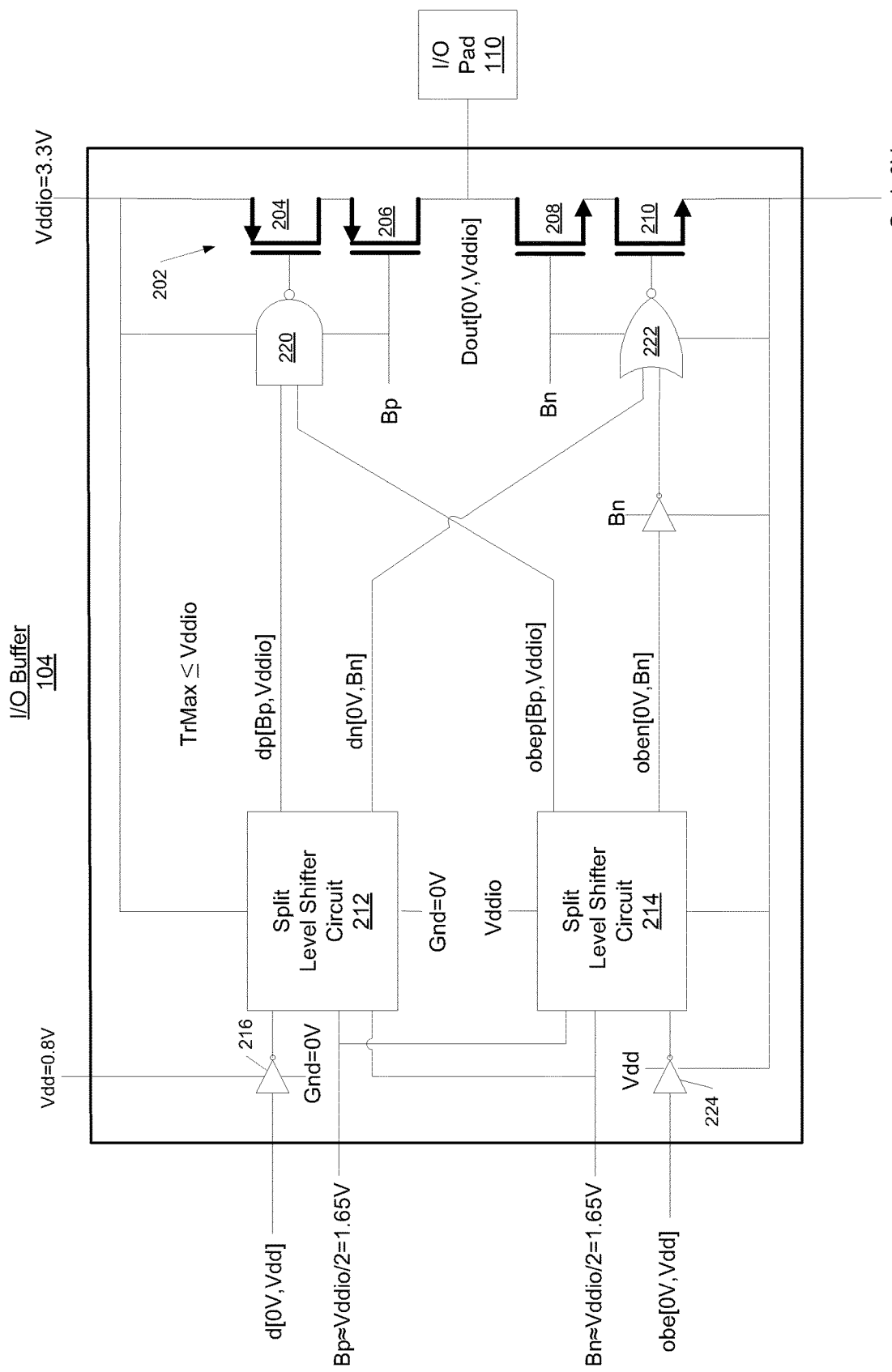
FIG. 2 is a mixed schematic and block diagram illustrating an example I/O buffer employed in the IC of FIG. 1.

With continuing reference to FIG. 1, FIG. 2 illustrates relevant components of an I/O buffer 104 that includes an output stage 202 coupled between output supply voltage Vddio=3.3V and ground Gnd=0V. Output stage 202 includes a stack of MOSFETs 204-210 arranged as shown. The drains of P-channel MOSFET 206 and N-channel MOSFET 208 are coupled together and to I/O pad 110. Output stage 202 drives I/O pad 110 with output data signal Dout=Vddio=3.3V when the input signal d=Vdd=0.8V, and output stage 202 drives I/O pad 110 with Dout=Gnd when the input signal d=Gnd.

The output interfaces of many I/O buffers are often required to operate with an output supply voltage Vddio that exceeds Tr Max, the maximum voltage that can be applied between the gate and source or between the gate and drain of MOSFETs. MOSFETs 206 and 208 are added to protect MOSFETs 204 and 210 from overvoltage damage. For ease of illustration it will be presumed that Tr Max=1.8V for the MOSFETs described herein. The gates of MOSFETs 206 and 208 are biased to voltages Bp≈1.65V and Bn≈1.65V, and as a result neither Vgs nor Vgd of the MOSFETs 206 or 208 should exceed Tr Max=1.8V while Vddio=3.3V. MOSFET 206 decouples the drain of MOSFET 204, and thus protects it from overvoltage when I/O pad 110 is driven to 0V by activated MOSFETs 208 and 210, and MOSFET 208 decouples the drain of MOSFET 210, and thus protects it from overvoltage when I/O pad 110 is driven to Vddio=3.3V by activated MOSFETs 204 and 206.

Split level shifter circuits 212 and 214 receive d and obe, respectively, from core circuit 102 after inversion by inverter circuits 216 and 224, respectively. Input data signal d and input control signal obe are low voltage signals or binary signals with logic levels [0V,Vdd] of the core voltage domain, where 0V is logic low, and Vdd=0.8V is logic high. Data signal Dout at the I/O pad 110 is a binary signal with logic levels [0V,Vddio] of the output voltage domain, where 0V is logic low, and Vddio=3.3V is logic high. Split level shifters 212 and 214 can translate the voltage levels of their respective input signals into high voltage, split level signals in order to accommodate the differences in voltage domains and the Tr Max limitations of MOSFETs 204 and 210.

Split level shifter 212 translates the low voltage inverted data signal d output from invertor 216 into a pair of high voltage, split level output signals dp and dn, which have logic levels [Bp,Vddio] and [0V,Bn], respectively, where Bp≈1.65V and Bn≈1.65V. NAND gate 220 and NOR gate 222 receive translated signals dp and dn, respectively. The outputs of NAND gate 220 and NOR gate 222 drive the gates of MOSFETs 204 and 210, respectively, with signals having logic levels [Bp,Vddio] and [0V,Bn], respectively. Under normal circumstances MOSFET 208 will not be damaged when its gate is driven to Bp=1.65V, and MOSFET 210 will not be damaged when its gate is driven to 0V or Bn=1.65V.

Split level shifter 214 translates the low voltage output of invertor 224 into a pair of high voltage, split level output signals obep and oben, which have logic levels [Bp,Vddio] and [Bn,0V], respectively. NAND gate 220 and NOR gate 222 receive obep and oben, respectively. If obe=0V, split level shifter 214 outputs obep=Bp=1.65V, which is a logic low input to NAND gate 220, and oben=Bn=1.65V, which is a logic high input to NOR gate 222, and as result NAND gate 220 and NOR gate 222 drives the gates of MOSFETs 204 and 210 to Vddio=3.3V and Gnd, respectively, which deactivates MOSFETs 204 and 210, and places output stage 202 in tri-state. When core circuit 102 asserts obe (e.t., obe=Vdd), I/O buffer 104 is enabled with NAND gate 220 and NOR gate 222 essentially operating as inverters that invert translated data signals dp and dn, respectively, before the signals are applied to the gates of MOSFETs 204 and 210, respectively.

Split level shifters 212 and 214, and logic gates 220 and 222, occupy a substantial amount of area of IC 100, and add complexity to the I/O buffers. Another problem may be that split level shifters 212 and 214 can be physically different or mismatched as a result of semiconductor process differences. The mismatch can lead to timing problems when the operating frequencies of the I/O buffers are high. Disclosed is a multi-voltage, high voltage I/O buffer, which addresses these problems and others.

Figure 3:
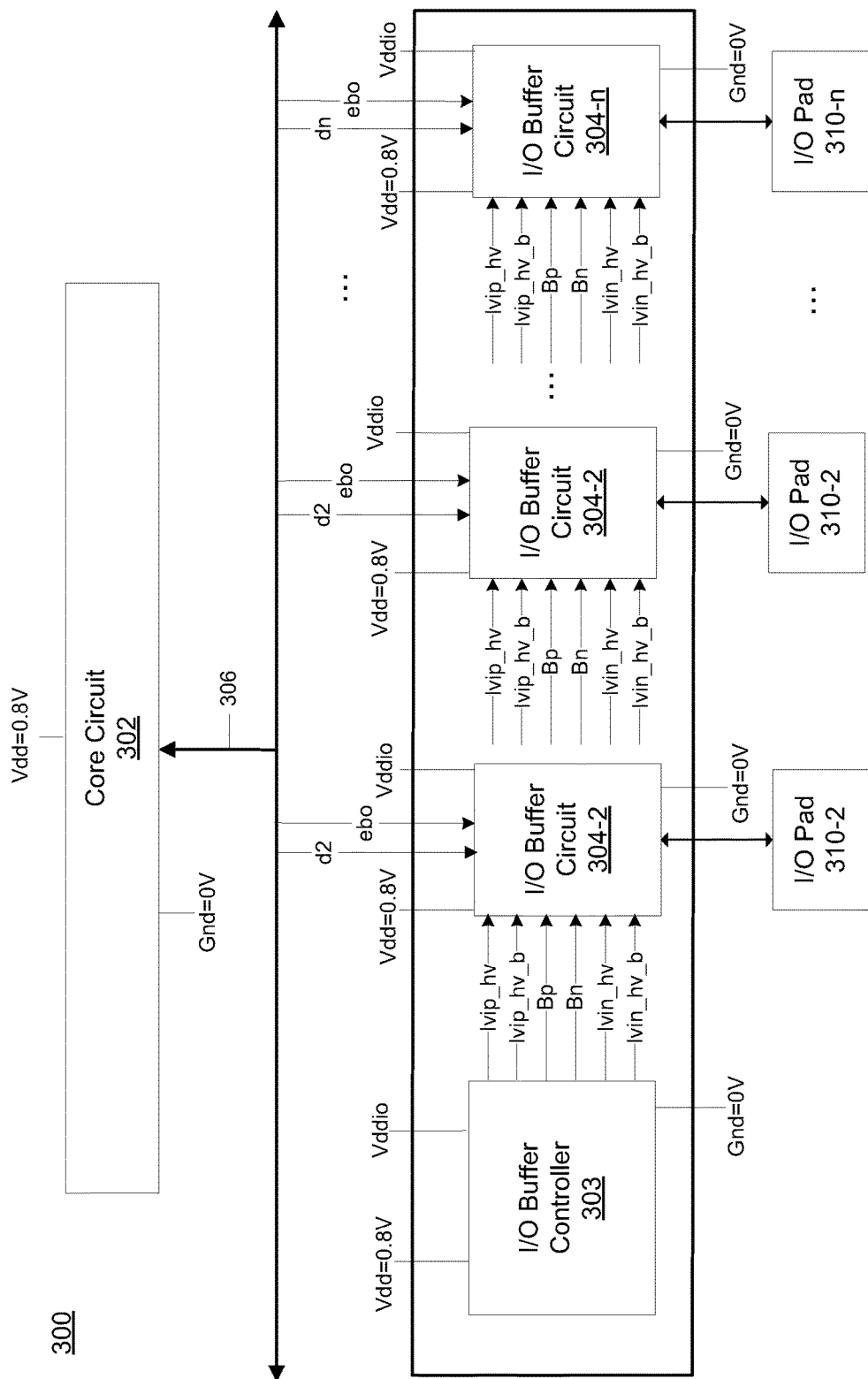
FIG. 3 is a block diagram that illustrates an example IC that includes I/O buffers according to one embodiment of the present disclosure.

FIG. 3 illustrates relevant components of an IC 300 in block diagram form, which employs multi-voltage, high voltage I/Os in low voltage technology according to one embodiment of the present disclosure. More particularly IC 300 includes core circuit 302 in data communication with a bank of I/O buffer circuits 304 via data bus 306. Each of the I/O buffers 304 is controlled by an I/O buffer controller circuit 303. Core circuit 302 is coupled to core supply voltage Vdd=0.8V, while I/O buffers 304 are coupled to Vdd and output supply voltage Vddio, which can be either 1.8V or 3.3V. The remaining disclosure will presume Vddio=3.3V except where noted. Core circuit 302 may include various devices including a CPU that communicates with components external to IC 300 via I/O buffers 304 and I/O pads 310. For example, each of the I/O buffers 304 can receive a low voltage data signal d for subsequent transmission to an external component.

Like the I/O buffers of FIG. 1, I/O buffers 304 receive low voltage obe from core circuit 102. I/O buffers 304 are tristated when obe=0V. I/O buffers 304 also receive high voltage control signals lvip_hv, lvin_hv, lvip_hv_b, and lvin_hv_b, and bias voltages Bp and Bn from I/O buffer controller 303. I/O buffer controller 303 generates bias voltages Bp and Bn for I/O buffers 304 based upon Vddio, which can be variable. Bp≈1.65V, and B≈1.65V when Vddio=3.3V, and Bp=0V, and Bn≈1.8V when Vddio=1.8V. In an alternative embodiment, I/O buffers may internally generate bias voltages Bp and Bn. I/O buffer 304 use of bias voltages Bp and Bn are more fully described below.

I/O buffer controller 303 monitors Vdd and/or Vddio by comparing them to respective threshold values V1 and V2. Although not shown I/O buffer controller 303 generates an lvi signal based on the comparison. I/O buffer controller 303 generates lvi=0V when Vdd and Vddio exceed their respective thresholds V1 and V2. However, if Vdd and/or Vddio are below their respective thresholds, I/O buffer controller 303 generates lvi=Vdd. Although not shown, I/O buffer controller 303 has a split level shifter, like that shown in FIG. 2, that level shifts lvi to produce lvin_hv and lvip_hv. Lvip_hv_b and lvin_hv_b are compliments of lvip_hv and lvin_hv, respectively. I/O buffer controller 303 outputs lvip_hv=Vddio, lvin_hv=Bn, lvip_hv_b=Bp and lvin_hv_b=0V if Vdd and/or Vddio are below respective threshold values. I/O buffers 304 are tristated if, at the very least, lvin_hv=Bn.

Figure 4:
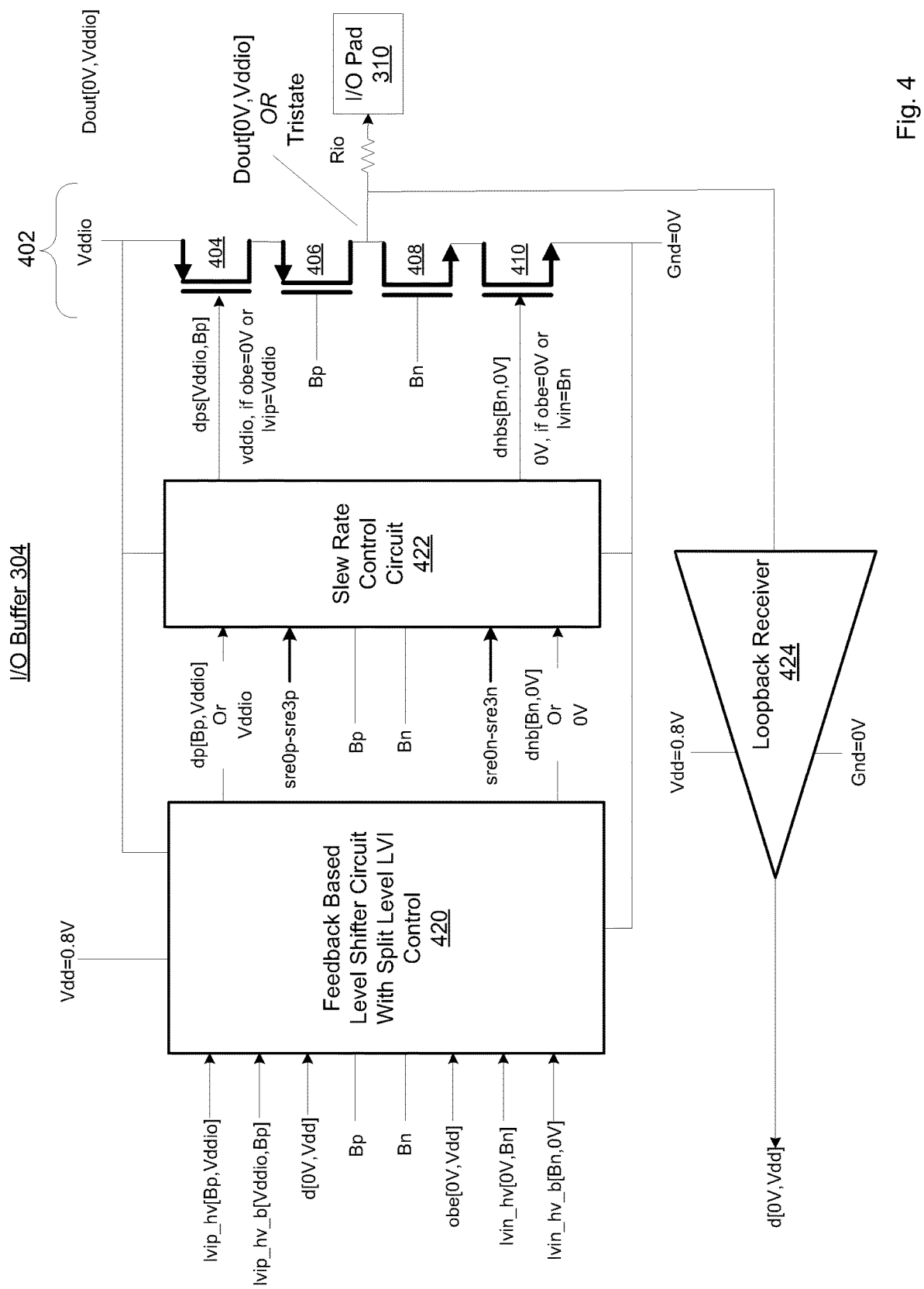
FIG. 4 is a mixed schematic and block diagram illustrating an example I/O buffer that can be employed in the IC of FIG. 3.

With continuing reference to FIG. 3, FIG. 4 illustrates relevant components of an example I/O buffer 304 according to one embodiment of the present disclosure. I/O buffer 304 receives low voltage signals d and obe, high voltage signals lvip_hv, lvip_hv_b, lvin_hv, and lvin_hv_b, and bias voltages Bp and Bn. I/O buffer 304 includes an output stage 402 that includes a stack of MOSFETs 404-410 arranged as shown between Vddio and Gnd. The drains of P-channel MOSFET 406 and N-channel MOSFET 408 are coupled together and to I/O pad 310 via resistor Rio. Resistor Rio is coupled to I/O pad 310 and takes form in a discrete device. Resistor Rio is added to control the output impedance of the I/O buffer 302. Typically, a 50 ohm driver output impedance is sought to match the 50 ohm resistance of the wire or trace that couples the I/O pad 310 to an external component such as a DRAM. Resistor Rio is designed to have with a resistance value that, in combination with resistance of MOSFETs 408 and 410, meets the 50 ohm goal. The gates of MOSFETs 406 and 408 are biased to Bp and Bn, and as a result neither Vgs nor Vgd of the MOSFETs 406 and 408 should exceed Tr Max=1.8V. MOSFETs 406 and 408 protect MOSFETs 404 and 410 from overvoltage as I/O pad 310 is driven to Vddio=3.3V or Gnd=0V; MOSFET 406 decouples the drain of MOSFET 404 when I/O pad 310 is driven to Gnd=0V by activated MOSFETs 408 and 410, and MOSFET 408 decouples the drain of MOSFET 410 when I/O pad 310 is driven to Vddio=3.3V by activated MOSFETs 404 and 406.

I/O buffer 304 also includes a feedback-based, level shifter circuit 420 (hereinafter FB level shifter 420) with split level lvi control, a slew rate control circuit 422, and the loopback receiver circuit 424, which has an input that is directly connected to the drains of MOSFETS 406 and 408 as shown of output stage 402. Assuming I/O buffer 304 is not tristated, output stage 402 drives I/O pad 110 to logic high or data Dout=Vddio when the input data signal d is logic high or d=Vdd, and output stage 402 drives I/O pad 310 to logic low or Dout=Gnd when the input signal d is logic low or d=Gnd.

Figure 5:
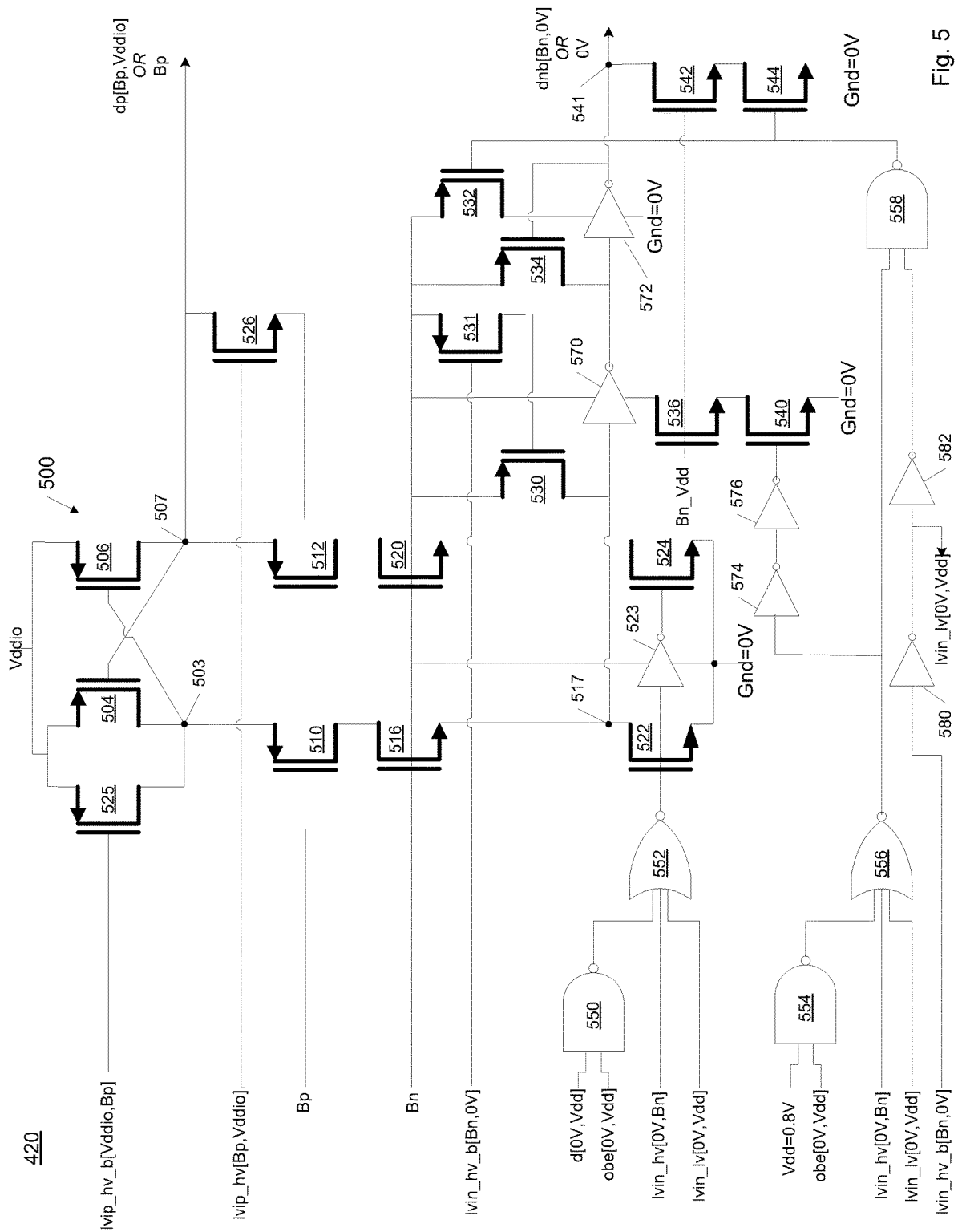
FIG. 5 is a schematic diagram illustrating one embodiment of the feedback based level shifter of FIG. 4.

FB level shifter 420 translates data d into signals with voltage levels that are compatible with the Tr Max limitations of MOSFETs employed in slew rate control circuit 422 and output stage 402. With continuing reference to FIG. 4, FIG. 5 illustrates one embodiment of FB level shifter 420, which generates high-voltage, split-level output signals at nodes 507 and 517, respectively. The output signals are received by slew rate control circuit 422. If obe=Vdd, and if Vdd and Vddio are above respective thresholds, FB level shifter shifts input data signal d[0V,Vdd] to produce split level signals dp[Bp,Vddio] and dnb[Bn,0V] at nodes 507 and 541, respectively. Otherwise, FB level shifter 420 outputs Bp and 0V at nodes 507 and 541.

FB level shifter 420 includes split level shifter 500, which includes P-channel MOSFETs 504-512 and N-channel MOSFETs 516-524 arranged as shown between Vddio and Gnd. Split level shifter 500 is substantially similar to the split level shifters shown in FIG. 2. One noticeable differences exist. While the outputs of split-level shifters 212 and 214 separately depend on obe and input signal d, respectively, the outputs of level shifter 500 concurrently depend on both obe and d. The gates of MOSFETs 504 and 506 connected to the drains of MOSFETs 506 and 504, respectively. The drains of MOSFETs 504 and 506 are coupled to the sources of MOSFETs 510 and 512, respectively. The gates of MOSFETs 510 and 512 are biased to Bp, which is 0V if Vddio=1.8V, or 1.65V if Vddio=3.3V. The drains of MOSFETs 510 and 512 are coupled to the drains of MOSFETs 516 and 520, respectively. The gates of MOSFETs 516 and 520 are biased to Bn, which is 1.8V if Vddio=1.8V, or 1.65V if Vddio=3.3V. The sources of MOSFETs 516 and 520 are coupled to the drains of MOSFETs 522 and 524, respectively. The sources of MOSFETs 522 and 524 are connected to Gnd. The gate of MOSFET 524 is driven output of invertor 523, while the gate of MOSFETS 22 is driven by the output of NOR gate 552.

FB level shifter 420 also includes NOR and NAND logic gates 550-558, and invertors 570-582. Although not shown within FIG. 5 logic gates 550-558, and invertors 574-582 are coupled between Vdd=0.8V and Gnd. Accordingly, logic gates 550-558, and invertors 574-582 output low voltage signals, or binary signals that switch between Vdd=0.8V and Gnd. Invertor 580 generates low voltage lvin_lv based on high-voltage input signal lvin_hv_b. Invertor 580 may generate lvin_lv=Vdd when Vddio is below threshold V2. NAND gate 550 receives low voltage data signal d, and low voltage obe. NOR gate 552 receives the output of NAND gate 550, low-voltage signal lvin_lv generated by invertor 580, and high voltage control signal lvin_hv. The output of NOR gate 552 drives the gate of MOSFET 522 and the input of inverter 523. NAND gate 554 receives obe and Vdd=0.8V. NOR gate 556 receives the output of NAND gate 554, high-voltage control signal lvin_hv, and low voltage control signal lvin_lv. NAND gate 558 receives the output of NOR gate 556 and invertor 582.

FB level shifter 420 further includes MOSFETs 525-544. MOSFET 525 is coupled in parallel with MOSFET 504 as shown. The gate of MOSFET 525 is controlled by lvip_hv_b. MOSFET 525 couples node 503 to Vddio when lvip_hv_b=Bp. The source of MOSFET 526 is coupled to node 507, while the drain of MOSFET 526 is biased to Bp. The gate of MOSFET 526 is controlled by lvip_hv. MOSFET 526 couples output node 507 to Bp when lvip_hv=Vddio. P-channel MOSFET 530 includes a source coupled to bias voltage Bn, and a drain coupled to the input of invertor 570 and the drain of MOSFET 531. The gate of MOSFET 530 is controlled by the output of the inverter 570. When the output of inverter 570 is driven to 0V, MOSFET 530 is activated to couple bias voltage Bn to the input of invertor 570. P-channel MOSFET 531 is coupled between bias voltage Bn and the output of invertor 470. The gate of MOSFET 531 is controlled by lvip_hv_b. When lvip_hv_b=0V, MOSFET 531 connects the input of invertor 572 to bias voltage Bn. P-channel MOSFET 534 is also coupled between bias voltage Bn and the input of invertor 572. The gate of P-channel MOSFET 534 is controlled by the output of invertor 572. MOSFET 534 connects the input of invertor 572 to Bn when the output of invertor 572 goes to 0V. P-channel MOSFET 532 is coupled between Bn and invertor 572. The gate of MOSFET 532 is controlled by the output of NAND 558. MOSFET 532 provides bias voltage Bn to invertor 572 when the output of NAND gate 558 goes to 0V. The output of NAND 558 also drives the gate of MOSFET 544 which is coupled between Gnd and protection MOSFET 542. The gate of MOSFET 542 is biased to Bn_Vdd. The gate of MOSFET 544 is biased to Bn_Vdd and normally activated thereby. Accordingly, output node 541 is pulled down to Gnd when MOSFET 544 is activated by a 0V output of NAND gate 558. The series combination of N-channel MOSFETs 536 and 540 are coupled between inverter 570 and Gnd. The gate of MOSFET 536 is biased to Bn_Vdd and normally activated thereby. The gates of MOSFET 540 is controlled by the output of NOR gate 556 via inverters 574 and 576. When activated MOSFET 540 couples Gnd to invertor 570 the activated MOSFET 536.

Split-level signals dp and dn at output nodes 507 and 541 of FB level shifter 420 are driven to Bp and 0, respectively, as noted above if obe=0V, lvin_hv=Bn, or lvin_lv=Vdd=0.8V regardless of the state of data signal d. With dp=Bp and dn=0V, I/O buffer 104 will tri-state. If obe=Vdd, lvin_hv=0V, and lvin_lv=0V, output nodes 507 and 541 will track low voltage data signal d. More particularly, if obe=Vdd, lvin_hv=0V, and lvin_lv=0V, then dp=Bp and dn=Bn at output nodes 507 and 541, respectively, when data signal d=0V. When data signal d=Vdd, dp=Vddio and dn=0V at output nodes 507 and 541, respectively. In this manner a single level shifter (i.e. MOSFETs 504-524 and invertor 523 arranged as shown) is used to effectively level shift data signal d and obe with split-level lvi control.

Figure 6:
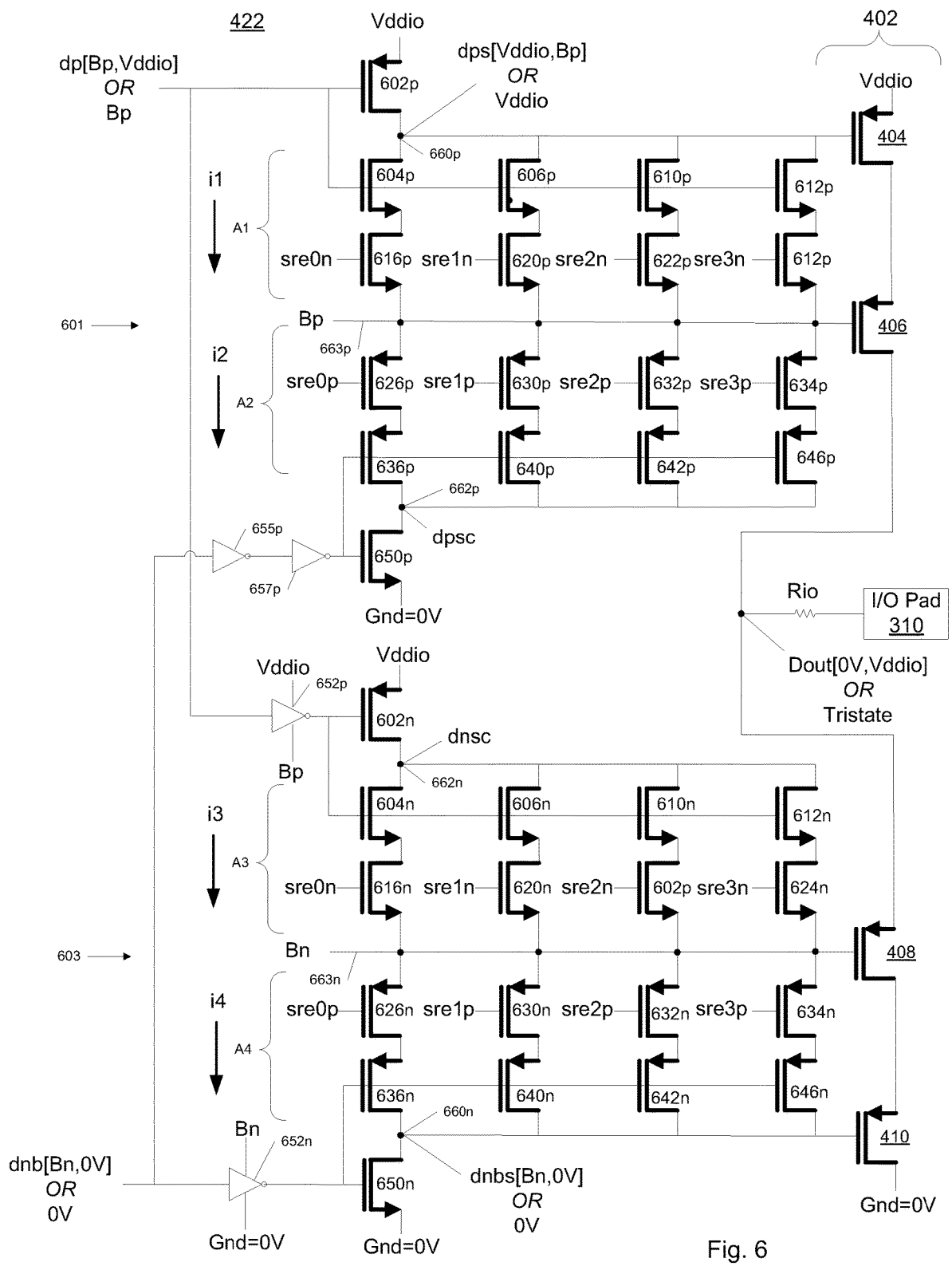
FIG. 6 is a schematic diagram illustrating one embodiment of the slew rate control circuit of FIG. 4.

FIG. 6 illustrates in schematic form, one embodiment of the slew rate control circuit 422 shown within FIG. 4. Slew rate control circuit 422 adjusts the slew or rate of transition of split-level data signals dp and dn based upon control signals sre0p-sre3p and sre0n-sre3n provided by core circuit 302. Slew rate control circuit 422 balances current injected/ejected from lines 663p and 663n that provide Bn and Bp, respectively, to various nodes, to reduce voltage perturbations on the lines, which could otherwise create timing mismatches and distort output signal Dout. Slew rate control circuit 422 includes sub circuits 601 and 603. Sub circuit 601 includes MOSFETs 602p-650p arranged as shown. Sub circuit 603 includes MOSFETs 602n-650n arranged as shown. Slew rate control circuit 422 also includes inverters 652p, 652n, 655p, and 655n. Invertor 652p drives the gate of MOSFET 602n based on input signal dp[Bp,Vddio] or Bp, while invertor 652n drives the gate of MOSFET 650p based upon input signal dnb[Bn,0V] or 0V. Output nodes 660p and 660n are coupled to the gates of MOSFETs 404 and 410, respectively, and as a result the signals at output nodes 660p and 660n control the output stage 402.

With continuing reference to FIG. 6, sub-circuit 601 includes P-channel MOSFET 602, which is coupled between Vddio and node 660p. The gate of MOSFET 602p is controlled by i.e., dp[Bp,Vddio] or Bp, the signal generated by FB level shifter 420 at output node 507 shown in FIG. 5. The drains of each of the N-channel MOSFETs 604p-612p are coupled to node 660p, while the gates of these MOSFETs are controlled by dp[Bp,Vddio] or Bp. The sources of MOSFETs 604p-612p are coupled to the drains of N-channel MOSFET 616p-624p, respectively. The gates of MOSFETs 616p-624p are controlled by sre0n-sre3n, respectively. MOSFET 602p is activated when MOSFETs 604p-612p are deactivated, and vice versa. When MOSFET 602p is activated, node 660p is driven to Vddio. While MOSFET 602p is deactivated, and MOSFETs 604p-612p are activated, one or more activated MOSFETS 616p-624p couple Bp to node 660p. When node 660p transitions from Vddio to Bp, current it is drained from node 660p through group A1 of activated MOSFETs until the voltage at node 660p drops to Bp. The rate of transition of the voltage at node 660p depends upon the number of activated MOSFETs in group A1. P-channel MOSFETs 626p-634p have sources connected to Bp as shown. P-channel MOSFETs 636p-646p have sources coupled to the respective drains of MOSFETs 626p-634p. The drains of MOSFETs 636p-646p are coupled to the drain of N-channel MOSFETs 650p. The source of MOSFET 650p is coupled to Gnd. The gate of MOSFET 650p is controlled by the output of invertor 657p. MOSFET 650p is activated while MOSFETs 636p-646p are deactivated, and vice versa. When MOSFET 650 is activated, node 662p is pulled down to Gnd. The gates of MOSFETs 626p-634p are controlled by sre0p-sre3p, respectively. With MOSFETs 636p-646p activated by the output of invertor 657pn, node 662p is coupled to Bp by activated MOSFETs in group A2. As a result node 662p will charge up to Bp via current i2. The rate at which node 662p charges up to Bp depends upon number of MOSFETs activated in group A2. Bp is coupled to the gate of MOSFET 406.

Sub-circuit 603 includes P-channel MOSFET 650n, which is coupled between Gnd and node 660n. The gate of MOSFET 650n is controlled by inversion of dnb[Bn,0V] or 0V, the signal generated by FB level shifter 420 at output node 541 shown in FIG. 5. The drains of each of the P-channel MOSFETs 636n-646n are coupled to node 660n, while the gates of these MOSFETs are controlled by the inversion of dnb[Bn,0V] or 0V. The sources of MOSFETs 636n-646n are coupled to the drains of P-channel MOSFET 626n-634n, respectively. The gates of MOSFETs 626n-634n are controlled by sre0p-sre3p, respectively. MOSFET 602n is activated when MOSFETs 604n-612n are deactivated, and vice versa. When MOSFET 602n is activated, node 662n is driven to Vddio. While MOSFET 602n is deactivated, and MOSFETs 604n-612n are activated, one or more activated MOSFETS 616n-624n couple Bn to node 662n. When node 662n transitions from Vddio to Bn, current i3 is drained from node 662n through activated MOSFETs in group A3 until the voltage at node 662n drops to Bn. The rate of transition of the voltage at node 662n depends upon the number of activated MOSFETs in group A3. P-channel MOSFETs 626n-634n have sources connected to Bn as shown. P-channel MOSFETs 636n-646n have sources coupled to the respective drains of MOSFETs 626n-634n. The drains of MOSFETs 636n-646n are coupled to the drain of N-channel MOSFETs 650n. The source of MOSFET 650n is coupled to Gnd. The gate of MOSFETs 650n and MOSFETs 636n-646n are controlled by the output of invertor 652n. MOSFET 650n is activated while MOSFETs 636n-646n are deactivated, and vice versa. When MOSFET 650n is activated, node 660n is pulled down to Gnd. The gates of MOSFETs 626n-634n are controlled by sre0p-sre3p, respectively. With MOSFETs 636n-646n activated by the output of invertor 650n, node 660n is coupled to Bn by activated MOSFETs 626n-634n in group A4. As a result node 660n will charge up to Bn via current i4. The rate at which node 660n charges up to Bn depends upon number of activated MOSFETs in group A4.

Figure 7:
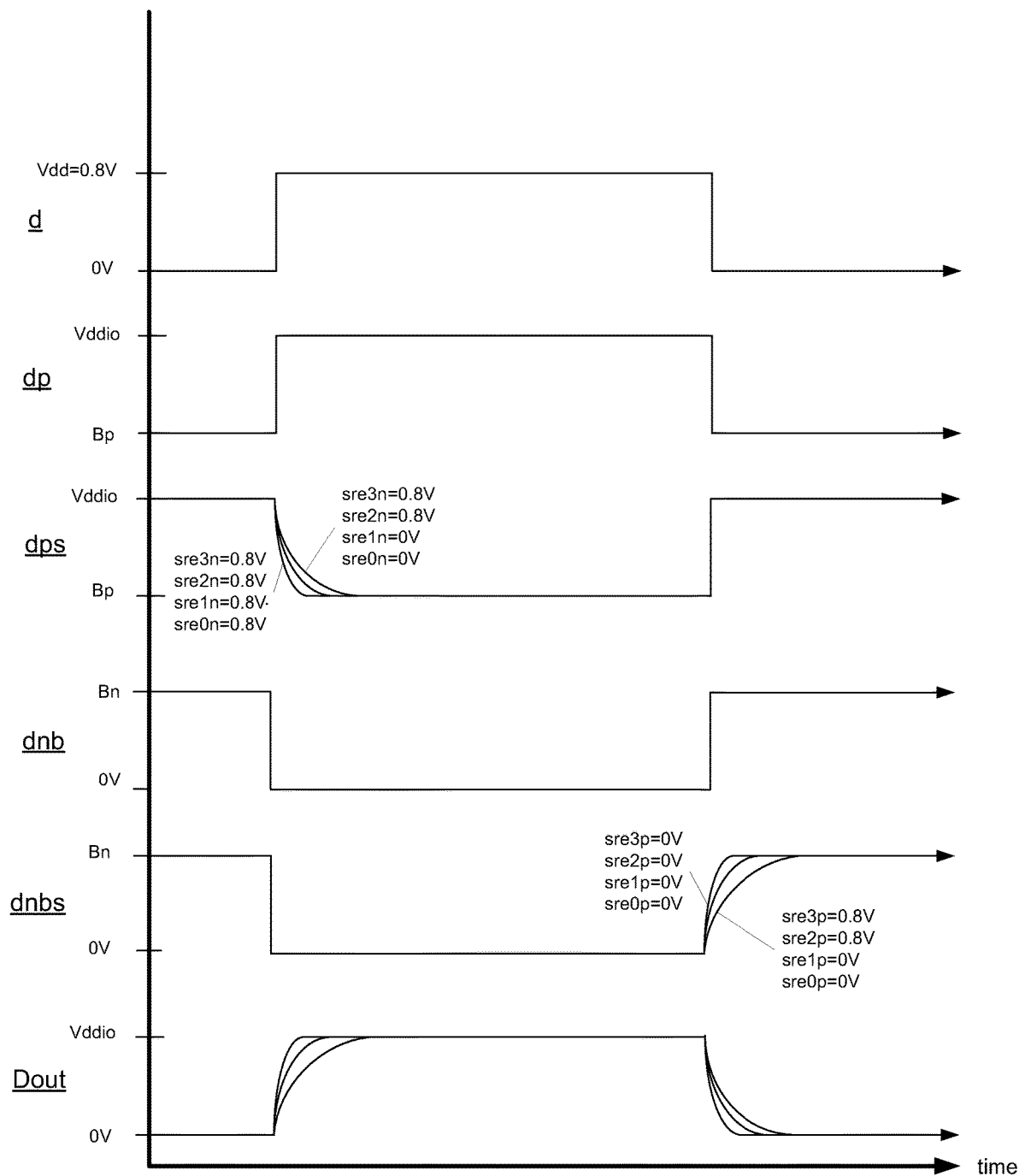
FIG. 7 are timing diagrams illustrating operational aspects of the slew rate control circuit of FIG. 6.

As noted slew rate control circuit 422 adjusts slew rate of output signals dp and do from FB level shifter 420. FIG. 7 illustrates timing diagrams that better explain slew rate adjustment. The timing diagrams presume I/O buffer 304 is not tristated by obe=Vdd=0.8V, lvin_hv=Bn, or lvin_lv=Vdd=0.8V. FIG. 7 shows timing diagrams for input signal d to FB level shifter 420, and timing diagrams for corresponding output signals dp and do from FB level shifter 420. FIG. 7 shows additional timing diagrams for dps and dnsb, which are the signals generated at node 660p and 660n, respectively, which in turn drive the gates of MOSFETs 404 and 410, respectively, of the output stage 402. Lastly FIG. 7 shows a timing diagram for Dout. As shown, the rate at which dps falls depends upon sre0n-sre3n, and the rate at which dnsb rises depends upon sre0p-sre3p. Since dps and dnsb control the output stage 402, the rate at which Dout rises and falls also depends upon sre0p-sre3p and sre0n-sre3n.

Figure 8:
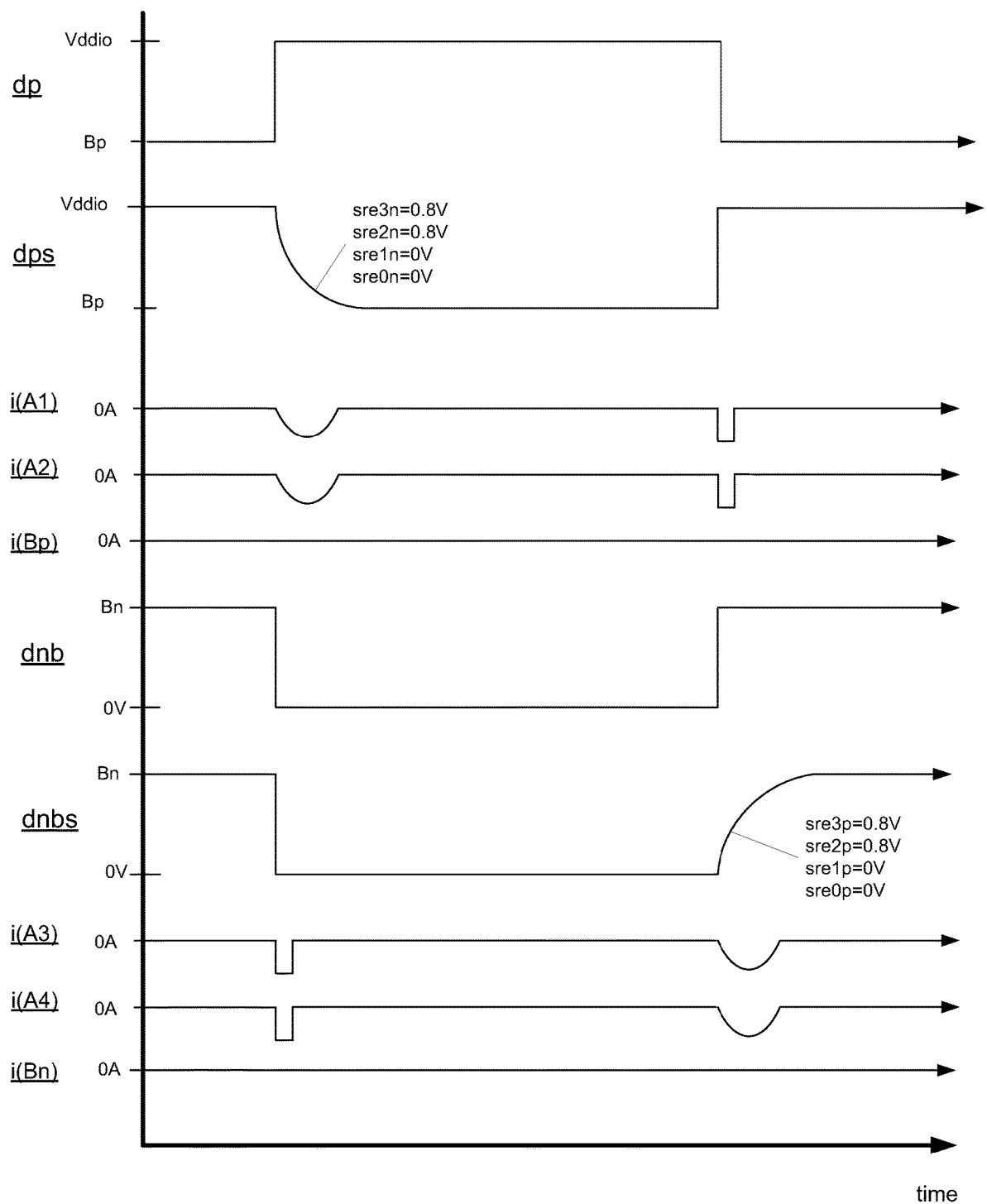
FIG. 8 are timing diagrams illustrating operational aspects of the slew rate control circuit of FIG. 6.

FIG. 8 illustrates timing diagrams dp, dps, dnb, and dnbs from FIG. 7. In addition FIG. 8 illustrates timing diagrams for i1-i4. FIG. 8 shows that current i1, which flows into line 663p, equals current i2, which flows out of line 663p when sre0p-sre3p equal sre0n-sre3n, respectively. As a result, no net current i(Bp) is injected into or drained from line 663n. As a result, Bp is stabilized during signal switching. Likewise FIG. 8 shows that current i3, which flows into line 663n, equals current i3, which flows out of line 663n when sre0p-sre3p equal sre0n-sre3n, respectively. As a result, no net current i(Bn) is injected into or drained from line 663n. As a result, Bn is stabilized during signal switching.

Returning to FIG. 4, I/O buffer 304 includes a loopback receiver 424 with an input coupled directly to the output of the drains MOSFETs 406 and 408 as shown. ICs employ loopback so that the core circuits can see the data signals d that they send to the I/O buffers. In the past a receiver is provided with an input coupled to the I/O pad. The receiver receives the output signal Dout from the output stage of the I/O buffer after the output signal Dout passes through Rio. Unfortunately, resistor Rio degrades the signal received at the input of the receiver. Loopback receiver 424 is coupled directly to the output stage 402 and translates signal Dout back into signal d for subsequent processing by core circuit 302 in order to determine operational aspects.

An integrated circuit (IC) is provided that includes an input/output (I/O) buffer which in turn includes a logic circuit, a level shifter, and a control circuit. The logic circuit is configured to generate a signal based on a data signal and a first control signal. The level shifter is coupled between a supply voltage terminal and a ground terminal. The level shifter is configured to generate first and second output signals in first and second voltage domains, respectively, at first and second nodes, respectively, based on the signal from the logic circuit. The control circuit is coupled between the second node and a third node. The control circuit transmits the second output signal to the third node when the first control signal is asserted, and the control circuit couples the third node to the ground terminal when the first control signal is not asserted. The I/O buffer may further include an I/O pad, and an output stage for driving the I/O pad. The output stage may include first and second transistors that are controlled by the voltages at the first and third nodes, respectively. The I/O buffer may further include an I/O pad, and an output stage for driving the I/O pad. The output stage may include first and second P-channel MOSFETs coupled in series, and first and second N-channel MOSFETs coupled in series, wherein the series coupled P-channel MOSFETs are coupled in series with the series coupled N-channel MOSFETs between the supply voltage terminal that is configured to receive a supply voltage Vddio and the ground terminal configured to receive a ground voltage. Drains of the second P-channel MOSFET and the first N-channel MOSFET can be connected together and to the I/O pad. The gate of the second P-channel MOSFET can be biased to Vddio/2. A gate of the first N-channel MOSFET can be biased to Vddio/2. A gate of the first P-channel MOSFET may be controlled by the voltage at the first node, while a gate of the second N-channel MOSFET is controlled by the voltage at the third node. The level shifter may include a first stack of MOSFETs coupled between the supply voltage terminal and the ground terminal. The first stack may include first and second P-channel MOSFETs coupled in series, and first and second N-channel MOSFETs coupled in series. The series coupled P-channel MOSFETs and the series coupled N-channel MOSFETs of the first stack can be coupled in series between the supply voltage terminal and the ground terminal. The source and drain of the first and second N-channel MOSFETs of the first stack can be connected to each other and to the second terminal. The I/O buffer may further include a pair of inverters coupled in series between the second and third nodes. The IC may further include a core circuit configured to generate the data signal and the first control signal in an input voltage domain, wherein the first, second, and input voltage domains are distinct from each other.

In another embodiment an integrated circuit is provided that includes an I/O buffer which in turn includes an I/O pad, logic circuit, a level shifter, and a control circuit. The logic circuit is configured to generate a signal based on first and second input signals. The level shifter is configured to generate first and second output signals based on the signal from the logic circuit. The control circuit is configured to receive the second output signal and the first input signal. The output stage is configured to drive the I/O pad, wherein the output stage comprises first and second transistors. The control circuit is configured to activate or deactivate the second transistor based on the second output signal while the first input signal is asserted, and the control circuit is configured to deactivate the second transistor while the first input signal is not asserted. The first and second input signals may have input logic levels [LVI,HVI] where LVI defines a voltage for logic low and HVI defines a voltage for logic high. The first output signal may have first logic levels [LV1,HV1] where LV1 defines a voltage for logic low and HV1 defines a voltage for logic high. The second output signal may have second logic levels [LV2,HV2] where LV2 defines a voltage for logic low and HV2 defines a voltage for logic high. HV1, HV2, and HVI should be distinct from each other. The first input signal can be asserted when it is set to HVI, and the first input signal should not asserted when it is set to LVI. The output stage may include first and second P-channel MOSFETs coupled in series, first and second N-channel MOSFETs coupled in series, wherein the series coupled P-channel MOSFETs are coupled in series with the series coupled N-channel MOSFETs between a supply voltage terminal configured to receive a supply voltage Vddio, and a ground terminal configured to receive a ground voltage. The first P-channel MOSFET can be the first transistor, and the second N-channel MOSFET can be the second transistor. Drains of the second P-channel MOSFET and the first N-channel MOSFET can be connected together and to the I/O pad. A gate of the second P-channel MOSFET can be biased to Vddio/2. A gate of the first N-channel MOSFET can be biased to Vddio/2. The level shifter may include a first stack of MOSFETs, which in turn includes first and second P-channel MOSFETs coupled in series, and first and second N-channel MOSFETs coupled in series. The series coupled P-channel MOSFETs and the series coupled N-channel MOSFETs of the first stack can be coupled in series between the supply voltage terminal and the ground terminal. The source and drain of the first and second N-channel MOSFETs of the first stack can be connected to each other and to a first terminal where the second output signal is generated. The logic circuit can receive a third input signal, and wherein the logic circuit is configured to generate the output signal based on the first, second and third input signals. The IC of this embodiment may further include a core circuit configured to generate the first and second input signals, wherein the first input signal comprises an I/O buffer enable signal, and wherein the second input signal comprises a data signal.

In yet another embodiment an integrated circuit (IC) is provided that includes an I/O buffer, which in turn includes an I/O pad, an output stage, a logic circuit, a level shifter, and a control circuit. The output stage is configured to drive the I/O pad. The logic circuit is configured to generate a binary output signal based on first and second binary input signals. The level shifter is configured to generate first and second binary output signals based on the binary output signal from the logic circuit. The control circuit is configured to receive the first binary input signal and the second binary output signal. The control circuit is configured to control the output stage based on the first binary input signal and the second binary output signal. The output stage may include first and second P-channel MOSFETs coupled in series, a first and second N-channel MOSFETs coupled in series, wherein the series coupled P-channel MOSFETs are coupled in series with the series coupled N-channel MOSFETs between a supply voltage terminal configured to receive a supply voltage Vddio and a ground terminal configured to receive a ground voltage. Drains of the second P-channel MOSFET and the first N-channel MOSFET can be connected together and to the I/O pad. A gate of the second P-channel MOSFET can be biased to Vddio/2. A gate of the first N-channel MOSFET can be biased to Vddio/2. The control circuit may include first and second invertors coupled in series, and an activation circuit, wherein the first invertor is configured to receive the second binary output signal, wherein the activation circuit is configured to deactivate the second invertor when the first binary input signal is not asserted, and wherein the activation circuit is configured to activate the second invertor when the first binary input signal is asserted. The control circuit may include an output configured to control the voltage at a gate of the second N-channel MOSFET, wherein the control circuit is configured to activate or deactivate the second N-channel MOSFET based on the second binary output signal while the first binary input signal is asserted, and wherein the control circuit is configured to deactivate the second N-channel MOSFET while the first binary input signal is not asserted. The first and second binary input signals may have input logic levels [LVI,HVI] where LVI defines a voltage for logic low and HVI defines a voltage for logic high. The first binary output signal hay have first logic levels [LV1,HV1] where LV1 defines a voltage for logic low and HV1 defines a voltage for logic high. The second binary output signal may have second logic levels [LV2,HV2] where LV2 defines a voltage for logic low and HV2 defines a voltage for logic high. HV1, HV2, and HVI should be distinct from each other. The IC of this embodiment may further include a core circuit configured to generate the first and second binary input signals, wherein the first binary input signal comprises an I/O buffer enable signal, and wherein the second binary input signal comprises a data signal. The level shifter may include a first stack of MOSFETs which in turn includes first and second P-channel MOSFETs coupled in series, first and second N-channel MOSFETs coupled in series, wherein the series coupled P-channel MOSFETs and the series coupled N-channel MOSFETs of the first stack are coupled in series between the supply voltage Vddio terminal and the ground terminal. The source and drain of the first and second N-channel MOSFETs of the first stack may be connected to each other and to a first terminal where the second binary output signal is generated.

An integrated circuit (IC) is also provided that in one embodiment includes an input/output (I/O) buffer, which in turn includes an I/O pad, a logic circuit, a level shifter, and a control circuit. The logic circuit is configured to generate a logic signal based on a data input signal in an input voltage domain and a first control signal. The level shifter is coupled between a supply voltage terminal and a ground terminal, wherein the level shifter is configured to generate first and second outputs in first and second voltage domains, respectively, at first and second nodes, respectively, based on the logic signal. The control circuit is coupled between the second node and a third node, and configured to receive the first control signal in the input voltage domain, and a second control signal in the second voltage domain. The control circuit is configured to transmit the second output to the third node when the first and second control signals are not asserted, and the control circuit is configured to couple the third node to the ground terminal when the first or second signal is asserted. The input, first, and second output voltage domains are distinct from each other. The I/O buffer may further include an output that stage includes first and second P-channel MOSFETs coupled in series, and first and second N-channel MOSFETs coupled in series. The series coupled P-channel MOSFETs can be coupled in series with the series coupled N-channel MOSFETs between the supply voltage terminal that is configured to receive supply voltage Vddio, and the ground terminal THe drains of the second P-channel MOSFET and the first N-channel MOSFET can be connected together and to the I/O pad. A gate of the second P-channel MOSFET can be configured to receive a bias voltage Bp=Vddio/2. The gate of the first N-channel MOSFET can be configured to receive a bias voltage Bn=Vddio/2. A gate of the first P-channel MOSFET can be controlled by the voltage at the first node. A gate of the second N-channel MOSFET can be controlled by the voltage at the third node. The split level shifter may include a first stack of MOSFETs, which in turn includes first and second P-channel MOSFETs coupled in series, and first and second N-channel MOSFETs coupled in series. The series coupled P-channel MOSFETs and the series coupled N-channel MOSFETs of the first stack can be coupled in series between the supply voltage terminal and the ground terminal A source and drain of the first and second N-channel MOSFETs of the first stack can be connected to each other and to a terminal where the second output is generated. The logic circuit of the IC can be configured to generate the logic signal based on the data input signal, the first control signal, and the second control signal. The I/O buffer may further include a discrete resistor device coupled between the output stage and the I/O pad, and a receiver having an input connected between the output stage and the discrete resistor, and an output configured to generate a loopback signal in the input voltage domain based on a signal generated at the output stage. The discrete resistor can be configured with an impedance, which when combined with an impedance of the output stage, matches an impedance of a conductive trace when it is connected to the I/O pad. The I/O buffer may further include a slew rate control circuit coupled between the split level shifter and the output stage. The slew rate control circuit can generate an adjusted first output by adjusting a falling edge slew rate of the first output. The output stage is configured to receive the adjusted first output.

Another integrated circuit (IC) is provided that includes an input/output (I/O) buffer, which in turn includes an I/O pad, an output stage, a discrete resistor coupled between the output stage and the I/O pad, a first receiver, and a split domain level shifter. The first receiver has an input coupled between the output stage and the discrete resistor. The split domain level shifter is configured to generate first and second outputs in first and second voltage domains, respectively, based on an input logic signal in an input voltage domain. The output stage is configured to drive the I/O pad via the discrete resistor based on the first and second outputs. The first receiver is configured to generate a first signal based on a signal generated by the output stage and provided to the discrete resistor. The discrete resistor can be configured with an impedance, which when combined with an impedance of the output stage, matches an impedance of a conductive trace when it is connected to the I/O pad. The I/O buffer may further include a second receiver with an input coupled to the I/O pad, wherein the second receiver is configured to generate a second signal based on a signal received at the I/O pad from a device external to the IC. The other IC may further include a core circuit coupled to the I/O buffer, the I/O buffer may further include a logic circuit configured to receive an input data signal from the core circuit, and the logic circuit can be configured to generate the input logic signal provided to the split domain level shifter. The core circuit can receive the first signal from the first receiver for subsequent processing. The logic circuit can be configured to receive a first control signal from the core circuit, and the logic circuit can be configured to generate the input logic signal provided to the split domain level shifter based on the input data signal and the first control signal.

Yet another integrated circuit (IC) is provided that includes an input/output (I/O) buffer that includes output stage coupled to an I/O pad, a level shifter, and a slew rate control circuit. The level shifter is configured to generate first and second output signals in first and second voltage domains, respectively, based on an input signal. The slew rate control circuit is coupled between the split level shifter and the output stage. The slew rate control circuit is configured to generate an adjusted first output signal by adjusting a falling edge slew rate of the first output signal. The output stage is configured to receive the adjusted first output signal and configured to drive the I/O pad based on the adjusted first output signal. The I/O buffer may further include an inverter for inverting the second output signal to generate an inverted second output signal, and the slew rate control circuit can generate an adjusted, inverted second output signal by adjusting a rising edge slew rate of the inverted second output signal. The output stage can receive the adjusted, inverted second output signal and may be configured to drive the I/O pad based on the adjusted, inverted second output signal. The slew rate control circuit can be configured to generate an adjusted second output signal by adjusting a rising edge slew rate of the second output signal, and the output stage can be configured to receive the adjusted second output signal and configured to drive the I/O pad based on the adjusted second output signal. The slew rate control circuit can receive a plurality of first signals, and the slew rate control circuit can adjust the falling edge slew rate of the first output signal based on the plurality of first signals. The IC of this embodiment may further include a core circuit that is configured to provide the plurality of first signals to the slew rate control circuit. The slew rate control circuit may include a P-channel MOSFET comprising a gate, a source, and a drain, wherein the gate is configured to receive the first output signal, and the source is coupled to a terminal that is configured to receive a supply voltage Vddio. The slew rate control circuit may further include a first plurality of N-channel MOSFETs each comprising a gate, a source, and a drain, wherein the gates of the first plurality of N-channel MOSFETs are coupled to receive the first output signal, wherein the drains of the first plurality of N-channel MOSFETs are coupled to the drain of the P-channel MOSFET. Lastly the slew rate control circuit may also include a second plurality N-channel MOSFETs each comprising a gate, a source, and a drain, wherein the gates of the second plurality of N-channel MOSFETs are coupled to receive the plurality of first signals, respectively, wherein the drains of the second plurality of N-channel MOSFETs are coupled to the sources of the first plurality of N-channel MOSFETs, respectively, and wherein the drains of the second plurality N-channel MOSFETs are coupled to receive a bias voltage.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. An integrated circuit (IC) comprising:
an input/output (I/O) buffer comprising:
a logic circuit configured to generate a signal based on a data signal and a first control signal;
a level shifter coupled between a supply voltage terminal and a ground terminal, wherein the level shifter is configured to generate first and second output signals in first and second voltage domains, respectively, at first and second nodes, respectively, based on the signal from the logic circuit;
a control circuit coupled between the second node and a third node, wherein the control circuit transmits the second output signal to the third node when the first control signal is asserted, and wherein the control circuit couples the third node to the ground terminal when the first control signal is not asserted.

2. The IC of claim 1 wherein the I/O buffer further comprises:
an I/O pad;
an output stage for driving the I/O pad, the output stage comprising first and second transistors;
wherein the first and second transistors are controlled by the voltages at the first and third nodes, respectively.

3. The IC of claim 1 wherein the I/O buffer further comprises:
an I/O pad;
an output stage for driving the I/O pad, the output stage comprising:
first and second P-channel MOSFETs coupled in series;
first and second N-channel MOSFETs coupled in series;
wherein the series coupled P-channel MOSFETs are coupled in series with the series coupled N-channel MOSFETs between the supply voltage terminal that is configured to receive a supply voltage Vddio and the ground terminal configured to receive a ground voltage;
wherein drains of the second P-channel MOSFET and the first N-channel MOSFET are connected together and to the I/O pad;
wherein a gate of the second P-channel MOSFET is biased to Vddio/2;
wherein a gate of the first N-channel MOSFET is biased to Vddio/2;
wherein a gate of the first P-channel MOSFET is controlled by the voltage at the first node;
wherein a gate of the second N-channel MOSFET is controlled by the voltage at the third node.

4. The IC of claim 3 wherein the level shifter comprises:
a first stack of MOSFETs coupled between the supply voltage terminal and the ground terminal;
wherein the first stack comprises first and second P-channel MOSFETs coupled in series, and first and second N-channel MOSFETs coupled in series, wherein the series coupled P-channel MOSFETs and the series coupled N-channel MOSFETs of the first stack are coupled in series between the supply voltage terminal and the ground terminal, and wherein the source and drain of the first and second N-channel MOSFETs of the first stack are connected to each other and to the second node.

5. The IC of claim 1 wherein the I/O buffer further comprises a pair of inverters coupled in series between the second and third nodes.

6. The IC of claim 1 further comprising:
a core circuit configured to generate the data signal and the first control signal in an input voltage domain;
wherein the first, second, and input voltage domains are distinct from each other.

7. An integrated circuit (IC) comprising:
an input/output (I/O) buffer comprising:
an I/O pad;
a logic circuit configured to generate a signal based on first and second input signals;
a level shifter configured to generate first and second output signals based on the signal from the logic circuit;
a control circuit configured to receive the second output signal and the first input signal;
an output stage configured to drive the I/O pad, wherein the output stage comprises first and second transistors;
wherein the control circuit is configured to activate or deactivate the second transistor based on the second output signal while the first input signal is asserted;
wherein the control circuit is configured to deactivate the second transistor while the first input signal is not asserted.

8. The IC of claim 7 wherein:
the first and second input signals have input logic levels [LVI,HVI] where LVI defines a voltage for logic low and HVI defines a voltage for logic high;
the first output signal has first logic levels [LV1,HV1] where LV1 defines a voltage for logic low and HV1 defines a voltage for logic high;
the second output signal has second logic levels [LV2, HV2] where LV2 defines a voltage for logic low and HV2 defines a voltage for logic high;
wherein HV1, HV2, and HVI are distinct from each other.

9. The IC of claim 8 wherein:
the first input signal is asserted when it is set to HVI;
the first input signal is not asserted when it is set to LVI.

10. The IC of claim 7 wherein the output stage comprises:
first and second P-channel MOSFETs coupled in series;
first and second N-channel MOSFETs coupled in series;
wherein the series coupled P-channel MOSFETs are coupled in series with the series coupled N-channel MOSFETs between a supply voltage terminal configured to receive a supply voltage Vddio, and a ground terminal configured to receive a ground voltage;
wherein the first P-channel MOSFET is the first transistor, and the second N-channel MOSFET is the second transistor;
wherein drains of the second P-channel MOSFET and the first N-channel MOSFET are connected together and to the I/O pad;
wherein a gate of the second P-channel MOSFET is biased to Vddio/2;
wherein a gate of the first N-channel MOSFET is biased to Vddio/2.

11. The IC of claim 10 wherein the level shifter comprises:
a first stack of MOSFETs comprising:
first and second P-channel MOSFETs coupled in series;
first and second N-channel MOSFETs coupled in series;
wherein the series coupled P-channel MOSFETs and the series coupled N-channel MOSFETs of the first stack are coupled in series between the supply voltage terminal and the ground terminal;

wherein the source and drain of the first and second N-channel MOSFETs of the first stack are connected to each other and to a first terminal where the second signal is generated.

12. The IC of claim 7 wherein the logic circuit is configured to receive a third input signal, and wherein the logic circuit is configured to generate the signal based on the first, second and third input signals.

13. The IC of claim 7 further comprising:
a core circuit configured to generate the first and second input signals;
wherein the first input signal comprises an I/O buffer enable signal;
wherein the second input signal comprises a data signal.

14. An integrated circuit (IC) comprising:
an input/output (I/O) buffer comprising:
an I/O pad;
an output stage configured to drive the I/O pad;
a logic circuit configured to generate a binary output signal based on first and second binary input signals;
a level shifter configured to generate first and second binary output signals based on the binary output signal from the logic circuit;
a control circuit configured to receive the first binary input signal and the second binary output signal;
wherein the control circuit is configured to control the output stage based on the first binary input signal and the second binary output signal.

15. The IC of claim 14 wherein the output stage comprises a first and second P-channel MOSFETs coupled in series;
a first and second N-channel MOSFETs coupled in series;
wherein the series coupled P-channel MOSFETs are coupled in series with the series coupled N-channel MOSFETs between a supply voltage terminal configured to receive a supply voltage Vddio and a ground terminal configured to receive a ground voltage;
wherein drains of the second P-channel MOSFET and the first N-channel MOSFET are connected together and to the I/O pad;
wherein a gate of the second P-channel MOSFET is biased to Vddio/2;
wherein a gate of the first N-channel MOSFET is biased to Vddio/2.

16. The IC of claim 14 wherein the control circuit comprises first and second invertors coupled in series, and an activation circuit, wherein the first invertor is configured to receive the second binary output signal, wherein the activation circuit is configured to deactivate the second invertor when the first binary input signal is not asserted, and wherein the activation circuit is configured to activate the second invertor when the first binary input signal is asserted.

17. The IC of claim 15 wherein the control circuit comprises an output configured to control the voltage at a gate of the second N-channel MOSFET, wherein the control circuit is configured to activate or deactivate the second N-channel MOSFET based on the second binary output signal while the first binary input signal is asserted, and wherein the control circuit is configured to deactivate the second N-channel MOSFET while the first binary input signal is not asserted.

18. The IC of claim 14 wherein:
the first and second binary input signals have input logic levels [LVI,HVI] where LVI defines a voltage for logic low and HVI defines a voltage for logic high;
the first binary output signal has first logic levels [LV1, HV1] where LV1 defines a voltage for logic low and HV1 defines a voltage for logic high;
the second binary output signal has second logic levels [LV2,HV2] where LV2 defines a voltage for logic low and HV2 defines a voltage for logic high;
wherein HV1, HV2, and HVI are distinct from each other.

19. The IC of claim 14 further comprising:
a core circuit configured to generate the first and second binary input signals;
wherein the first binary input signal comprises an I/O buffer enable signal;
wherein the second binary input signal comprises a data signal.

20. The IC of claim 14 wherein the level shifter comprises:
a first stack of MOSFETs comprising:
first and second P-channel MOSFETs coupled in series;
first and second N-channel MOSFETs coupled in series;
wherein the series coupled P-channel MOSFETs and the series coupled N-channel MOSFETs of the first stack are coupled in series between a supply voltage Vddio terminal and a ground terminal;
wherein the source and drain of the first and second N-channel MOSFETs of the first stack are connected to each other and to a first terminal where the second binary output signal is generated.

* * * * *